United States Patent
Teowee et al.

(10) Patent No.: US 10,006,281 B2
(45) Date of Patent: Jun. 26, 2018

(54) CALIBRATION OF MOLDED PIEZOELECTRIC LONGITUDINAL CHARGE COEFFICIENT OF A PRESSURE SENSOR FOR BLASTING OPERATION

(71) Applicant: Austin Powder Company, Cleveland, OH (US)

(72) Inventors: Gimtong Teowee, Westlake Village, CA (US); Bryan E. Papillon, Phoenixville, PA (US); James D. Heckelman, Norwalk, OH (US); Chris Munroe, Collins, OH (US)

(73) Assignee: Austin Star Detonator Company, Cleveland, OH (US)

( * ) Notice: Subject to any disclaimer, the term of this patent is extended or adjusted under 35 U.S.C. 154(b) by 253 days.

(21) Appl. No.: 14/976,521

(22) Filed: Dec. 21, 2015

(65) Prior Publication Data

US 2016/0108720 A1  Apr. 21, 2016

Related U.S. Application Data

(63) Continuation-in-part of application No. 13/764,021, filed on Feb. 11, 2013.

(Continued)

(51) Int. Cl.
*E21B 47/06* (2012.01)
*G01L 25/00* (2006.01)
(Continued)

(52) U.S. Cl.
CPC ............... *E21B 47/06* (2013.01); *F42D 1/05* (2013.01); *F42D 1/055* (2013.01); *F42D 5/02* (2013.01);
(Continued)

(58) Field of Classification Search
CPC ......... G01R 29/22; E21B 47/06; F23Q 3/002; F23Q 3/287; G01L 1/16; G01L 1/162;
(Continued)

(56) References Cited

U.S. PATENT DOCUMENTS 2,706,742 A  4/1955 Ehlers
3,304,773 A * 2/1967 Rogallo .................. G01G 3/13
310/331

(Continued)

FOREIGN PATENT DOCUMENTS

GB       2006571 A       5/1979
WO   WO 2007/093921 A2   8/2007
WO   WO 2011/082843 A1   7/2011

OTHER PUBLICATIONS

Guo et al, Measurements of Piezoelectric Coefficient d33 of Lead Zirconate Titanate Thin Films Using a Mini Force Hammer, Feb. 2013, vol. 135 / 011003-1.*

(Continued)

*Primary Examiner* — Daniel S Larkin
*Assistant Examiner* — David L Singer
(74) *Attorney, Agent, or Firm* — Fay Sharpe LLP

(57) ABSTRACT

A method of calibrating a coefficient of a pressure sensor for blasting operations, including striking a first piezoelectric sensor of a first unmolded pressure sensing apparatus; determining, with an interface circuit, a first peak voltage of the first piezoelectric sensor during the striking thereof, striking a second piezoelectric sensor of a second molded pressure sensing apparatus; determining with the interface circuit, a second peak voltage of the second piezoelectric sensor during the striking thereof, and calculating a piezoelectric constant of the second piezoelectric from at least the first and second peak voltages.

5 Claims, 10 Drawing Sheets

Related U.S. Application Data

(60) Provisional application No. 61/597,238, filed on Feb. 10, 2012.

(51) Int. Cl.

| | |
|---|---|
| *G01L 1/16* | (2006.01) |
| *G01L 27/00* | (2006.01) |
| *G01R 29/22* | (2006.01) |
| *F42D 1/05* | (2006.01) |
| *F42D 1/055* | (2006.01) |
| *F42D 5/02* | (2006.01) |
| *F42B 35/00* | (2006.01) |

(52) U.S. Cl.
CPC ............... *G01L 1/16* (2013.01); *G01L 25/00* (2013.01); *G01L 27/005* (2013.01); *G01R 29/22* (2013.01); *F42B 35/00* (2013.01)

(58) Field of Classification Search
CPC ....... G01L 25/00; G01L 5/0052; G01L 23/10; H02N 2/183; H01L 41/1132; H01L 41/053; H01L 41/0533
USPC ............... 73/1.15, 152.51, 712, 714, DIG. 4; 324/727; 252/62.9 R, 62.9 PZ; 702/98, 702/FOR. 143, FOR. 156; 310/340
See application file for complete search history.

(56) References Cited

U.S. PATENT DOCUMENTS

| | | | |
|---|---|---|---|
| 3,320,890 A | 5/1967 | Ciccone et al. | |
| 3,444,101 A | 5/1969 | Viernickel | |
| 3,856,693 A | 12/1974 | Kim | |
| 3,987,729 A | 10/1976 | Andrews et al. | |
| 4,051,396 A | 9/1977 | Berlincourt | |
| 4,099,407 A * | 7/1978 | Louit | G01L 1/16 324/727 |
| 4,203,004 A | 5/1980 | Cox | |
| 4,624,796 A * | 11/1986 | Giniewicz | H01L 41/187 252/62.9 R |
| 4,826,616 A * | 5/1989 | Tanino | C04B 35/491 252/62.9 R |
| 4,921,928 A * | 5/1990 | Tanino | C08G 59/50 204/157.82 |
| 5,133,257 A | 7/1992 | Jonsson | |
| 5,173,569 A | 12/1992 | Pallanck et al. | |
| 5,435,248 A | 7/1995 | Rode et al. | |
| 5,747,722 A | 5/1998 | Gladden et al. | |
| 5,915,267 A * | 6/1999 | Kim | G01R 29/22 73/1.15 |
| 6,079,332 A | 6/2000 | Marshall et al. | |
| 7,804,223 B1 | 9/2010 | Teowee | |
| 8,373,551 B2 | 2/2013 | Laird et al. | |
| 8,622,923 B2 | 1/2014 | Pons et al. | |
| 9,016,133 B2 | 4/2015 | Besling et al. | |
| 2011/0006641 A1 * | 1/2011 | Cross | H01L 41/0986 310/338 |

OTHER PUBLICATIONS

Austing, James L., et al., "Carbon Resistor Gauges for Measuring Shock and Detonation Pressures; I. Principles of Functioning and Calibration", Propellants, Explosives, Pyrotechnics 15, pp. 205-215, 1991.

Tulis, Allen J., et al., "Carbon Resistor Gauges for Measuring Shock and Detonation Pressures; II. Detonation Pressure of Carbohydrate-Metal Composite Explosives", Propellants, Explosives, Pyrotechnics 16, pp. 216-220, 1991.

Austing, James L., et al., "Carbon Resistor Gauges for Measuring Shock and Detonation Pressures; III. Revised Calibration Data and Relationships", Propellants, Explosives, Pyrotechnics 20, pp. 159-169, 1995.

Gautschi, G., "Piezoelectric Sensorics;", IEEE Xplore Digital Library, Information and Automation (ICIA) 2010 International Conference held Jun. 20-23, 2010.

Karki, James, Texas Instruments Incorporated's Documentation titled "Signal Conditioning Piezoelectric Sensors", SLOA033A—Sep. 2000.

Hoffman, Karl, "An Introduction to Measurements using Strain Gages", Mar. 1987.

PCB Piezotronics, Inc.—Tech Support's documentation; http://www.pcb.com/techsupport/tech_pres.php, Copyright PCB Group, Inc. 2012 (printed Feb. 10, 2012).

Interfacing Piezo Film to Electronics by Measurement Specialties, Mar. 2006, Rev B.

IEEE Journal of Solid-State Circuits, vol. 45, No. 1, Jan. 2010, An Efficient Piezoelectric Energy Harvesting Interface Circuit Using a Bias-Flip Rectifier and Shared Inductor by Yogesh K. Ramadass and Anatha Chandrakasan.

Proceedings of the 37th Annual Conference on Explosives and Blasting Techniques Blasting Topologies for Electronic Initiation Systems by Teowee and Lasburg, Feb. 6-9, 2011 in San Diego.

Gautschi, G., "Piezoelectric Sensorics;", IEEE Xplore Digital Library, Information and Automation (ICIA) 2010 International Conference held Jun. 20-23, 2010, 27 pgs.

Wang, L. et al., "Piezoelectric Dynamic Pressure Sensor", Proc. Of 2010 IEEE International Conference on Information and Automation, Jun. 20-23, 2010, Harbin, China, pp. 906-911.

* cited by examiner

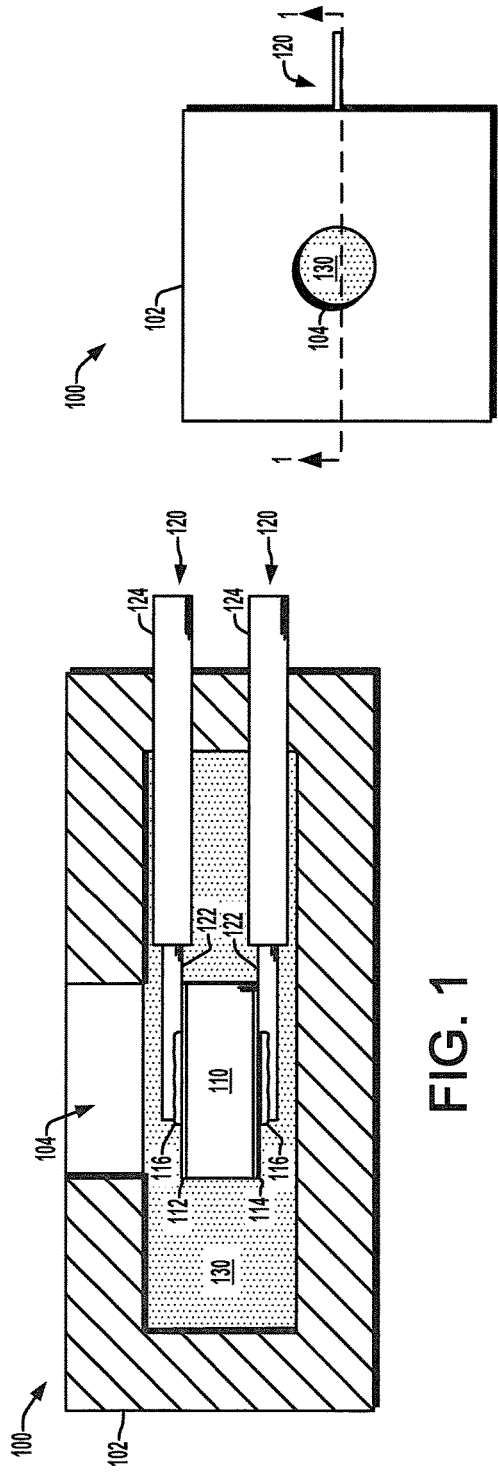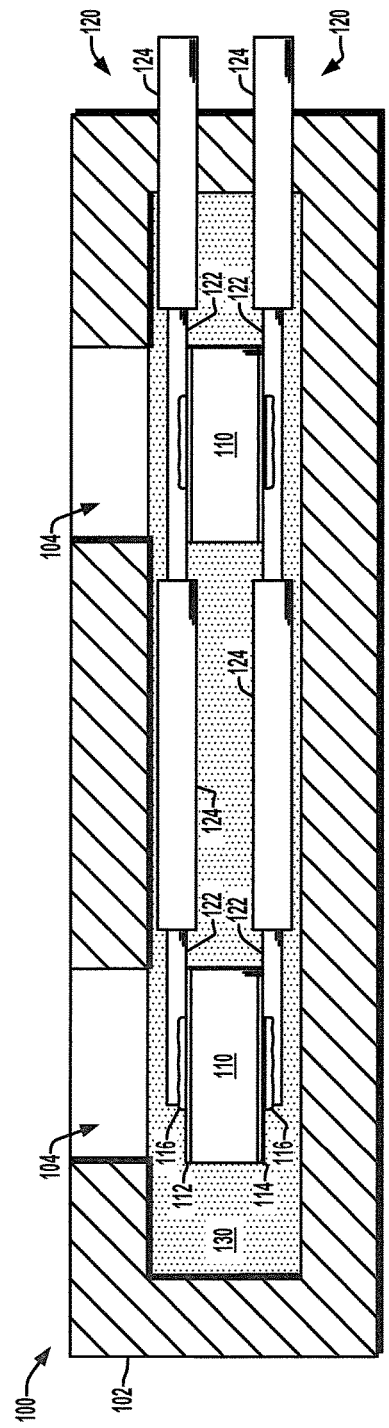

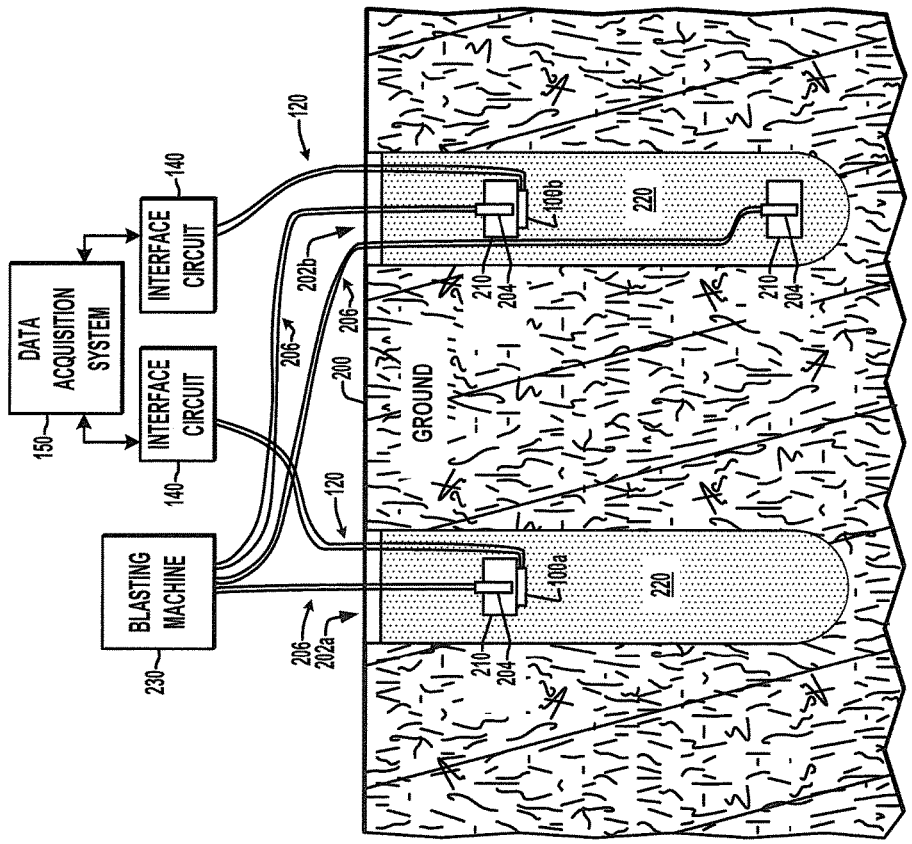
FIG. 6
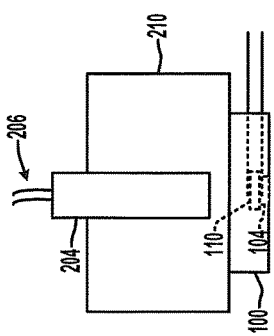
FIG. 4
FIG. 5

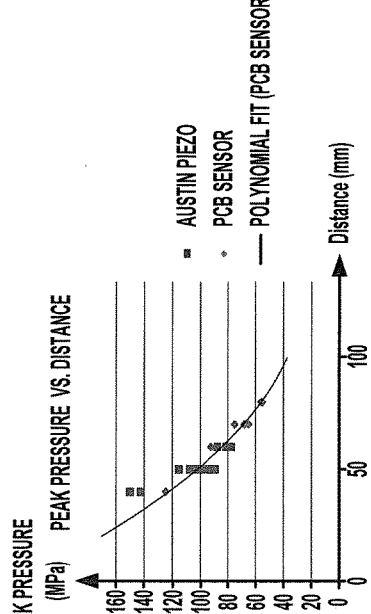
FIG. 17
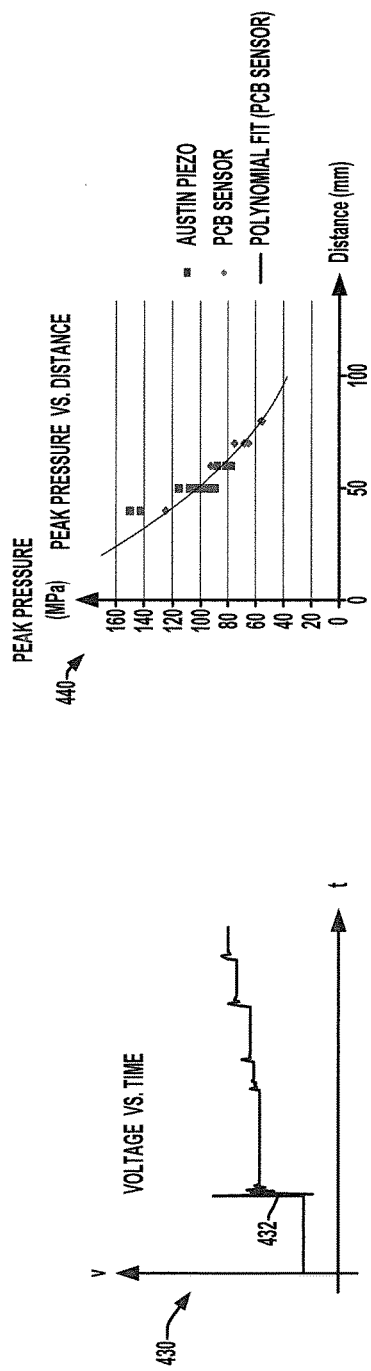
FIG. 19
FIG. 18
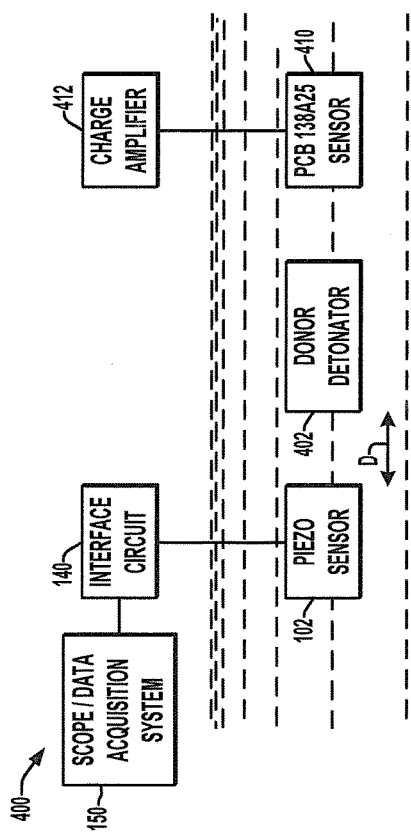
FIG. 16

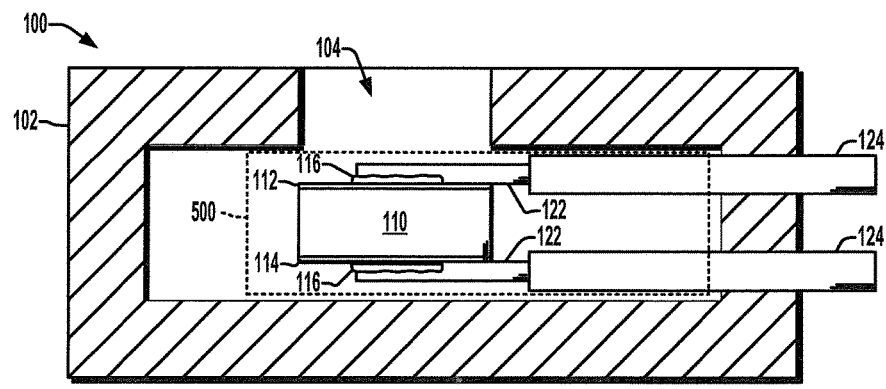
FIG. 24
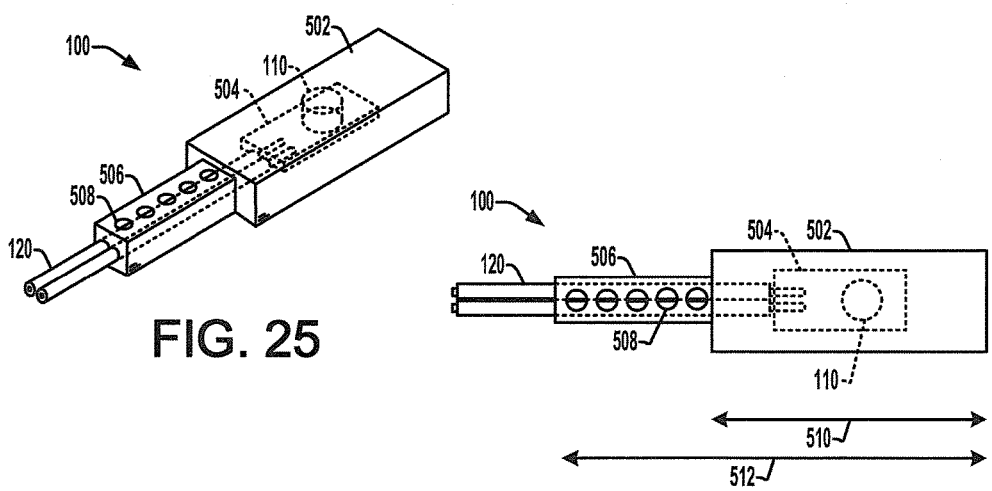
FIG. 25
FIG. 26
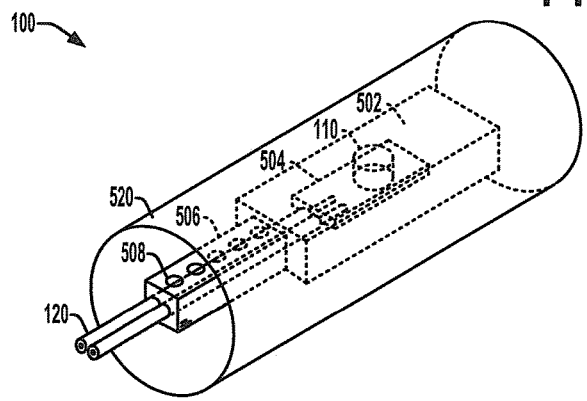
FIG. 27

CALIBRATION OF MOLDED PIEZOELECTRIC LONGITUDINAL CHARGE COEFFICIENT OF A PRESSURE SENSOR FOR BLASTING OPERATION

This application is a continuation-in-part of U.S. patent application Ser. No. 13/764,021, filed Feb. 11, 2013, which claims priority to and the benefit of U.S. Provisional Patent Application Ser. No. 61/597,238 that was filed on Feb. 10, 2012 and is entitled METHOD AND APPARATUS TO MEASURE BOREHOLE PRESSURE DURING BLASTING, the entirety of each of which is incorporated by reference herein.

TECHNICAL FIELD

The present disclosure involves blasting instrumentation technology in general, and particularly relates to techniques and apparatus for measuring borehole pressure during blasting.

BACKGROUND

In blasting and seismic measurement operations, detonators and explosives are buried in the ground, for example, in holes (often referred to as "bore holes") drilled into rock formations, etc., and the detonators are wired for external access to blasting machines that provide electrical signaling to initiate detonation of explosives. A tremendous amount of pressure is developed in the boreholes during blasting, and excessive pressure from the firing of one detonator may impair detonators, whether non-electric, electric, or electronic. This situation can be particularly problematic where a plurality of detonators are in a single borehole, and an earlier-firing detonator can produce a pressure wave that disables a later firing detonator in the same borehole. Dynamic pressures during blasting, especially sympathetic pressures from adjacent holes or underlying decks, have been suspected to cause misfires in electronic and non-electronic detonators. Measuring borehole pressures during detonation can facilitate understanding the magnitude of the pressure developed as a function of blasting conditions on the resulting fragmentation, and will help advance the blasting technology. Further, steps may be taken to alleviate such excess pressures based on borehole pressure measurements.

Thusfar, borehole pressure measurement is primarily done using carbon resistor sensors and strain gauges, which exhibit changes in electrical resistance upon external pressure conditions. However, carbon resistors and strain gauges are piezo-resistive i.e. the resistance changes with external pressure. These sensors, moreover, typically require elaborate mounting and must be supplied with a constant current or a voltage divider as well as thermal compensation and autozeroing via a bridge circuit for proper electrical biasing and feedback. Moreover, conventional borehole pressure measurement techniques are generally costly and complex. Manganin foil gauges have been used for high detonation pressures, and are attractive because of their extremely low thermal coefficient of resistivity and high sensitivity towards hydrostatic pressure. Conventional piezoelectric pressure sensors tend to be expensive and bulky, and often require bulky extraneous charge amplifiers and noise filtering electronics to acquire the signals. Thus, a need remains for improved techniques and apparatus for measuring borehole pressure during blasting operations.

SUMMARY

Various aspects of the present disclosure are now summarized to facilitate a basic understanding of the disclosure, wherein this summary is not an extensive overview of the disclosure, and is intended neither to identify certain elements of the disclosure nor to delineate the scope thereof. Instead, the primary purpose of this summary is to present some concepts of the disclosure in a simplified form prior to the more detailed description that is presented hereinafter.

The disclosure relates to use of piezoelectric devices to measure the peak borehole pressure during blasting, supported by an internal or external circuit interface with a simple charge integrator and appropriate storage capacitor(s) to provide an output signal indicative of peak borehole pressure associated with a blasting operation.

A pressure sensor apparatus as well as pressure sensor-equipped detonators and blasters are disclosed along with techniques for measuring borehole pressure during blasting operations. The pressure sensor apparatus comprises a housing with one or more holes or apertures, and one or more piezoelectric devices disposed within the interior of the housing, along with a pair of wire leads that are coupled with the piezoelectric device and which extend outside the sensor housing.

In certain embodiments, the piezoelectric device or devices at least partially face the aperture of the housing, and all or a portion of the housing interior may be provided with a filler material such as silicone grease to protect against moisture penetration and/or to provide mechanical coupling for transfer of a pressure wave to the piezoelectric device.

In certain embodiments, moreover, two or more piezoelectric devices are provided within the housing interior, and these can be coupled with one another into a single circuit, such as parallel connection, for improved signal to noise performance.

An interface circuit may be provided within the housing in certain embodiments, which includes a rectifier coupled with the piezoelectric device and one or more output capacitors to provide a signal to the wire leads, where the piezoelectric device's longitudinal charge coefficient and the interface circuit capacitance are selected to advantageously provide an output signal with a maximum voltage of about 3-5 V. In some embodiments, the longitudinal charge coefficient of the piezoelectric device is about 300 pC/N or more, such as about 500 pC/N or more, and the piezoelectric device may be made of a ceramic perovskite material, such as lead zirconate titanate (PZT).

In certain embodiments, the piezoelectric device(s) is at least partially covered with a heat shrink material. In various embodiments, moreover, the sensor apparatus further includes a metal shell.

In accordance with further aspects of the present disclosure, a pressure sensing apparatus is provided for measuring borehole pressure during blasting operations, which includes one or more piezoelectric devices encapsulated inside a molded structure, as well as a pair of wire leads electrically coupled with the piezoelectric device and protruding from the molded structure. In various implementations, the apparatus may further include metal shell at least partially surrounding the molded structure.

In accordance with further aspects of the present disclosure, the above described piezoelectric-based pressure sensor apparatus may be incorporated into a blasting detonator, such as within a detonator housing, and/or the sensor apparatus may be mounted to a booster assembly housing.

A method is provided for sensing pressure in a borehole during a blasting or seismic measurement operation in accordance with further aspects of the disclosure. The method includes locating a piezoelectric-type pressure sensor apparatus within the borehole, initiating a blasting operation, measuring an electrical signal on the pair of wire leads contemporaneously with the blasting operation, and determining a borehole pressure value at least partially according to the measured electrical signal. In certain embodiments, the method further includes connecting the pair of wire leads to an interface circuit, measuring an electrical signal at the output of the interface circuit, and determining the borehole pressure value based at least partially on the output of the interface circuit. In some embodiments, the pressure sensor apparatus is located proximate a detonator or a booster within the borehole.

In accordance with further aspects of the present disclosure, a pressure sensing apparatus for measuring borehole pressure during blasting operations includes at least one piezoelectric device encapsulated inside a molded structure. A pair of wire leads is electrically coupled with the piezoelectric device and protruding from the molded structure such that a first portion of each wire lead is encapsulated inside the molded structure and a second portion of each wire lead is outside of the molded structure.

In accordance with further aspects of the present disclosure, a pressure sensing apparatus for measuring borehole pressure during blasting operations includes at least one piezoelectric device encapsulated inside a molded structure. The molded structure includes a main portion and a lead wire support. A pair of wire leads is electrically coupled with the piezoelectric device such that a first portion of each wire lead is encapsulated inside the molded structure and a second portion of each wire lead is outside of the molded structure. The lead wire support includes at least one hole disposed on a top surface thereof to expose a portion of the wire leads and provide strain relief for the wire leads. The main portion of the molded structure includes an elongated profile with a substantially flat face that lies in a first plane. The piezoelectric device includes a sensing face that lies in a second plane that is generally oriented parallel to the first plane.

In accordance with further aspects of the present disclosure, a method of calibrating a pressure sensing apparatus for measuring borehole pressure during blasting operations is provided. The method includes: striking a first piezoelectric sensor of a first unmolded pressure sensing apparatus; determining, with an interface circuit, a first peak voltage of the first piezoelectric sensor during the striking thereof; striking a second piezoelectric sensor of a second molded pressure sensing apparatus; determining with the interface circuit, a second peak voltage of the second piezoelectric sensor during the striking thereof; and calculating a piezoelectric constant of the first piezoelectric sensor from at least the first and second peak voltages.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description of the disclosure when considered in conjunction with the drawings, in which:

FIG. 1 is a side elevation view in section illustrating an exemplary pressure sensor apparatus with a piezoelectric sensor inside a housing having a pressure interface apparatus for measuring borehole pressure in a blasting operation in accordance with one or more aspects of the present disclosure;

FIG. 2 is a top plan view illustrating the pressure sensor apparatus of FIG. 1;

FIG. 3 is a side elevation view in section illustrating another exemplary pressure sensor apparatus with a plurality of piezoelectric sensors proximate corresponding apertures in a common housing in accordance with further aspects of the disclosure;

FIG. 4 is a simplified side elevation view illustrating an exemplary booster equipped with a detonator and a piezoelectric-based pressure sensor apparatus according to further aspects of the disclosure;

FIG. 5 is a simplified side elevation view illustrating an exemplary detonator equipped with an internal piezoelectric-based pressure sensor apparatus in accordance with further aspects of the disclosure;

FIG. 6 is a partial side elevation view illustrating use of the piezoelectric-based pressure sensor apparatus in boreholes formed in the ground as part of a blasting operation, and connection thereof with external interface circuitry and a data acquisition system;

FIG. 16 is a partial schematic diagram illustrating an exemplary piezoelectric pressure measurement test setup with a piezoelectric sensor set a fixed distance from a donor detonator, along with a conventional PCB sensor and corresponding charge amplifier for comparative testing;

FIG. 17 is a graph illustrating a voltage output from the interface circuit in response to a pressure wave from a donor detonator spaced 60 mm away from the piezoelectric sensor in the setup of FIG. 16;

FIG. 18 is a graph illustrating an interface circuit output voltage waveform resulting from multiple pressure pulses in the test setup of FIG. 16;

FIG. 19 is a graph illustrating the pressures as a function of spacing distance using the conventional PCB sensor and the new piezoelectric sensor;

FIG. 24 is a sectional side elevation view illustrating another exemplary pressure sensor apparatus with a piezoelectric sensor inside a housing, where the piezoelectric sensor element is at least partially covered with a heat shrink material;

FIGS. 25 and 26 are perspective and top plan views illustrating another exemplary pressure sensor apparatus with a piezoelectric element encapsulated in a molded structure;

FIG. 27 is a perspective view illustrating another embodiment of the pressure sensor apparatus including a metal shell at least partially surrounding the molded structure;

DETAILED DESCRIPTION

Figure 7:
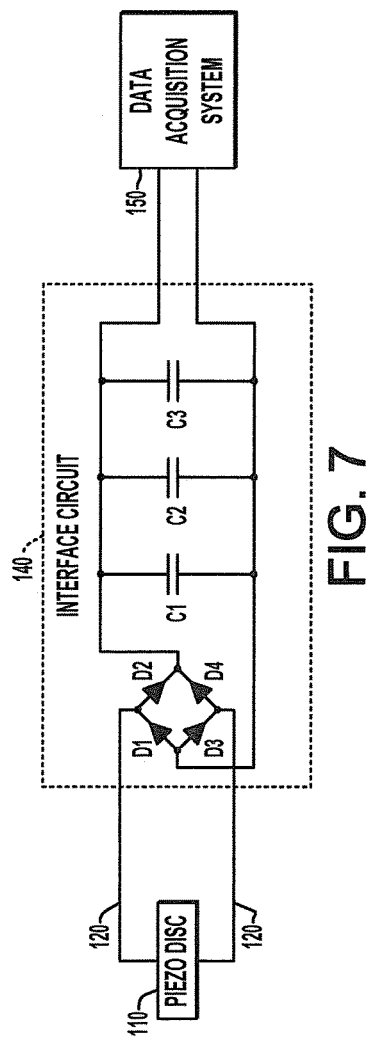
FIG. 7 is a schematic diagram illustrating an exemplary interface circuit with a rectifier input coupled to a piezoelectric disc and one or more capacitors coupled with the rectifier output for providing a signal to a data acquisition system.

Referring now to the figures, several embodiments or implementations of the present disclosure are hereinafter described in conjunction with the drawings, wherein like reference numerals are used to refer to like elements throughout, and wherein the various features and plots are not necessarily drawn to scale.

FIGS. 1 and 2 illustrate sectional side and top plan views of an exemplary piezoelectric pressure sensor apparatus 100 in accordance with one or more aspects of the disclosure. The sensor 100 includes a housing 102, such as wood, metal, plastic, or other sturdy rigid material that provides an interior cavity, and includes at least one hole or aperture 104 providing a passageway between the interior cavity and the exterior of the housing 102. As seen in FIG. 2, the housing 102 is generally rectangular shaped, but any suitable shape, aspect ratio and/or form factor may be used.

Within the interior of the housing 102 is a piezoelectric device 110 for sensing borehole pressures during blasting operations. In certain embodiments, the piezoelectric device is a disc-shaped (e.g., cylindrical) structure, but a piezoelectric device 110 of any suitable size, shape, aspect ratio and/or form factor may be used. In one embodiment, the piezoelectric device 110 is made from a material having a high $d_{33}$ longitudinal piezoelectric charge coefficient material property in order to generate high values of piezoelectric charge upon pressure pulses and thus afford a high signal-to-noise ratio during measurement operations. For instance, a ceramic perovskite material such as lead zirconate titanate (PZT) may be used, having a longitudinal charge coefficient of about 300 pC/N or more, more preferably about 500 pC/N or more, such as a NAVY Type 6 device 110 having a $d_{33}$ coefficient of about 650 pC/N, a disc diameter about 6.35 mm and a thickness of about 2 mm.

In general, the piezoelectric sensor device 110 develops a voltage (or potential difference) across two opposite faces when compressed in a direction orthogonal to the faces, and therefore at least one of the sensing faces of the piezoelectric device 110 preferably faces the pressure interface aperture 104 at least partially, as seen in FIG. 1. The device 110 can be made of any suitable piezoelectric material or materials, including without limitation piezoelectric ceramics and single crystal materials (gallium phosphate, quartz, tourmaline, lead magnesium niobate-lead titanate (PMN-PT), etc.), where piezoelectric ceramic materials (e.g., PZT) advantageously have high piezoelectric constants to provide better sensitivity and signal-to-noise ratio than is commonly obtainable using single crystal piezoelectric materials. Without being tied to any particular theory, PZT type materials exhibit electric dipole moments in solids, which can be induced for ions on crystal lattice sites with asymmetric charge surroundings (as in barium titanate ($BaTiO_3$) and PZT).

As seen in FIGS. 1 and 2, the piezoelectric device 110 is disposed within the interior cavity of the housing 102, and may be mounted or supported therein in any suitable manner. The apparatus 100 further includes a pair of wire leads 120 electrically coupled with the piezoelectric device 110 and extending from the interior cavity outside the housing 102. In one possible implementation, the top and bottom sensing faces of the disc-shaped piezoelectric device 110 are suitably provided with conductive electrode material 112 (top) and 114 (bottom) so that conductive portions 122 of the wires 120 can be soldered to the conductive faces 112, 114 using solder 116 as shown. The opposing faces of the piezoelectric discs in one example are metallized to form the electrodes 112, 114, preferably silver or Au—Pd to ensure solderability to subsequent exposed portions 122 of the wires 120. In certain embodiments, the piezoelectric disc 110 is preferably less than 0.5 inches in diameter and most preferably about 0.25 inches, wherein larger diameter discs may crack during the pressure pulses while very small discs 110 may be difficult to handle and to solder wires to. In other embodiments, any suitable form of electrical connection can be used to connect the conductive portions 122 of the lead wires 120 to the piezoelectric device 110. Other portions of the lead wires 120 may include insulation 124 as shown, which preferably extends to the external portions of the lead wires 120.

Figure 9:
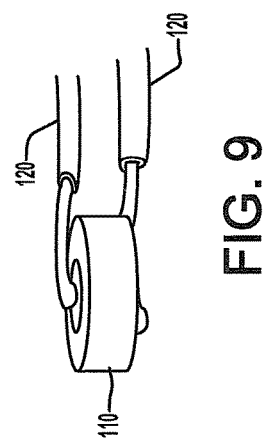
FIG. 9 is a perspective view showing an exemplary piezoelectric disc and corresponding lead wires for pressure sensing during blasting operations.

FIG. 9 is a photograph showing an exemplary piezoelectric disc 110 and corresponding soldered lead wires 120 for pressure sensing during blasting operations.

Returning to FIG. 1, with the leads 120 connected, the piezoelectric device 110 is then located within the interior cavity of the housing 102, and may be mounted in any suitable fashion using any suitable mechanical mounting apparatus (not shown), although not a requirement of the present disclosure. The enclosure housing 102 is preferably a sturdy structure that operates to inhibit ingress of moisture, water, fluid, dust, dirt, etc. so as to preserve the sensing capabilities of the device 110. In this regard, certain embodiments of the sensor apparatus include a filler material 130 provided within all or at least a portion of the interior cavity of the housing 102 in order to protect against moisture penetration and/or to provide mechanical coupling to transfer a pressure wave to the at least one piezoelectric device 110. In certain embodiments, for instance, the filler material 130 can be silicone grease. In addition, the piezoelectric device 110 is preferably located within the housing interior such that all or a portion of one of the sensing faces 112, 114 at least partially faces the aperture 104, wherein any included filler material 130 may, but need not, overlie the sensing face of the piezoelectric device 110.

As seen in FIG. 3, the apparatus 100 in certain embodiments may include two or more piezoelectric devices 110 within the interior cavity of the housing 102. In some implementations, moreover, multiple aperture holes 104 may be provided, preferably located so as to at least partially face a sensing surface or face of the piezoelectric devices 110. In order to improve sensing capability and to provide a higher signal-to-noise ratio of the apparatus, moreover, the piezoelectric devices 110 in certain embodiments are advantageously coupled with one another into a single circuit. For instance, multiple piezoelectric discs 110 can be arranged with their opposite faces electrically connected to one electrical path, such as by using a single top lead wire 120 as shown in FIG. 3 with multiple exposed conductive portions 122 soldered to the top faces of the piezoelectric devices 110, with a similar lower lead wire 120 having conductive portions 122 soldered to the bottom faces of the devices 110. Also, multilayer piezoelectric ceramics can be used in certain embodiments, wherein higher numbers of piezo discs or layers in the multilayer ceramics advantageously provide higher piezoelectric generated charge during impulse, and thus the better signal-to-noise ratio.

Referring also to FIGS. 4-6, FIG. 4 illustrates an exemplary booster 210 equipped with a detonator 204 and a piezoelectric-based pressure sensor apparatus 100 attached to the booster 210. The booster assembly 210 thus includes a booster housing to which the sensor housing is mounted using any suitable means, such as tape in one example. In the example of FIG. 4, the pressure sensor housing 102 is mounted to the bottom of the booster housing, although alternative embodiments are possible in which the pressure sensor housing 102 can be mounted using any suitable technique and structure to other sides or surfaces of the booster 210. For instance, the pressure sensor apparatus 100 may be advantageously located as close as possible to the detonator 204 that is operatively associated with the booster 210 such that the pressure measurements obtained by the sensor apparatus 100 can closely reflect the actual pressure seen in the borehole 202 by the detonator 204 to facilitate analysis of detonator performance in withstanding actual pressures seen in boreholes 202 prior to detonation of that detonator 204.

As seen in FIG. 5, the piezoelectric-based pressure sensor apparatus 100 may alternatively be provided as part of a detonator 204 for use in initiating a blasting operation. In this respect, the sensor 100 may be affixed to or otherwise mounted to the detonator apparatus 204 by any suitable means. As seen in the example of FIG. 5, for instance, the sensor apparatus 100 can be located inside a detonator shell, and may be crimped with the two piezo electrode wires 120 coming out from the shell, and the detonator/sensor assembly 204/100 may be lowered into a borehole by the detonator wires 206 and/or by the pressure sensor signal wires 120.

FIG. 6 illustrates use of the piezoelectric-based pressure sensor apparatus 100 in boreholes 202 formed in the ground 200 as part of a blasting operation. The simplified figure illustrates two such boreholes 202a and 202b packed with main explosives 220, with the first borehole 202a including a single detonator 204 installed within a single booster 210, and a pressure sensor apparatus 100a installed at the bottom of the booster housing 210. The detonator wires 206 are connected to a blasting machine 230, and the lead wires 120 of the sensor apparatus 100a are coupled to an external interface circuit 140, which in turn provides an interface output signal to a data acquisition system 150. In the second borehole 202b in FIG. 6, two detonator/booster assemblies 204/210 are positioned one above the other. The upper detonator/booster assembly 204/210 in borehole 202b includes a pressure sensor 100b mounted to the bottom of the booster 210. The upper detonator lead wires 206 of both detonators 204 are connected to the blasting machine 230, and the lead wires 120 of the sensor apparatus 100b are connected to another interface circuit 140, which in turn is connected to the data acquisition system 150.

In this example set up, both the sensors 100a and 100b can be used via the associated interface circuits 140 to obtain pressure measurements corresponding to the borehole pressures experienced by the associated boosters 210 and/or detonators 204 upon activation of the lower detonator 204 in the second borehole 202b. Thereafter, the sensor apparatus 100b can be used to detect borehole pressure in the second borehole 202b upon activation of the detonator 204, booster 210, and main explosive 220 in the first borehole 202a. This latter blasting operation will typically lead to destruction of the first sensor apparatus 100a, and subsequent activation of the upper detonator 204 in the second borehole 202b will similarly result in destruction of the corresponding sensor apparatus 100b. It is noted that this set-up can also be used to measure acceleration inside the borehole 202 and/or to measure vibration/acceleration and thus peak particle velocity on the surface of the ground 200 near the blasting array. The same set up can be used for associated borehole pressure measurements when the firing sequence involves initial detonation of the lower detonator 204 of borehole 202b, followed by activation of the upper detonator 204 of borehole 202b and then activation of the detonator 204 in the first borehole 202a.

Figure 8:
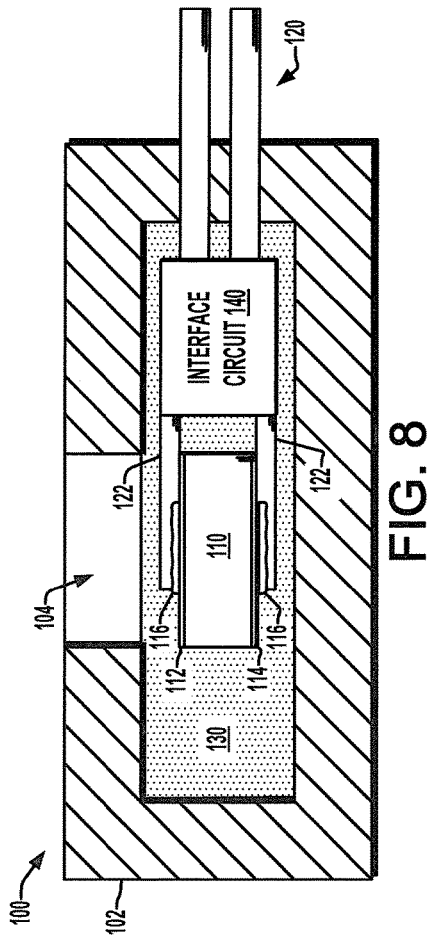
FIG. 8 is a partial side elevation view in section illustrating another exemplary pressure sensor apparatus with piezoelectric sensor and an interface circuit inside the housing in accordance with further aspects of the present disclosure.

Referring also to FIG. 7, the interface circuit 140 in certain embodiments can be external (e.g., as shown in FIG. 6) and/or may be internal to the sensor apparatus housing 102 (e.g., as shown in FIG. 8 discussed below). The exemplary interface circuit 140 in FIG. 7 includes a rectifier formed by diodes D1-D4 for full bridge rectification and subsequent capacitive integration of the voltage signal provided by the piezoelectric disc 110. Other embodiments are possible in which half bridge rectification can be used with either a single diode or a pair of diodes, or any suitable rectifier circuitry may be provided at the input of the interface circuit 130 for connection to the piezoelectric device or devices 110.

The output of the rectifier D1-D4 provides a rectified signal to one or more capacitances C1-C3, where three such capacitors are shown connected in parallel in the illustrated example of FIG. 7. Any suitable single capacitor or multiple-capacitor configuration can be used, including any suitable series and/or parallel connection of capacitor components in the interface circuit 140. In other embodiments, any suitable integrator circuit can be provided at the output of the rectifier. The signal provided by the rectifier output is thus connected across the capacitance and provided as an input signal to the data acquisition system 150. In certain embodiments, the longitudinal charge coefficient of the piezoelectric device 110 and the capacitance value are selected such that an output signal of the interface circuit 140 for a rated pressure provides a maximum voltage output of about 3-5V or any other desired voltage level to properly interface with analog-to-digital conversion (ADC) circuitry of the data acquisition system 150. For example, small values of capacitance of the interface circuit 140 (e.g., 1-20 nF) can lead to high voltage output (e.g., 100-200V) whereas large capacitance values (e.g. 1 or 2 uF) can results in maximum voltage output of 3 or 5V for pressures up to 20 kpsi in certain implementations using the above-mentioned PZT type piezoelectric device 110.

In operation, pressure pulses presented to the piezoelectric device 110 via the aperture 104 will generate electrical piezoelectric charges, which are channeled through the rectifier to the charge integrator which is a simple capacitor(s) in the illustrated embodiment. The capacitance is advantageously sized to limit the maximum voltage that can be sensed by the acquisition circuit 150 (FIG. 6). For example, using an I/O ADC pin on a microcontroller employed to sense and record the voltage output, a 1 uF capacitor will max out at 3V at a pressure peak of about 10 kpsi using a piezo exhibiting a $d_{33}$ coefficient of approximately 650 pC/N. This is important because the I/O pins on the microcontroller typically have a maximum rating, usually 3.3 or 5V input, beyond which the excessive voltage may damage the internal microcontroller circuitries.

Another embodiment of the pressure sensor apparatus 100 is illustrated in FIG. 8, in which an interface circuit 140 is provided within the interior cavity of the housing 102. For instance, a circuit board is provided with the rectifier and capacitance components of the interface circuitry 140 shown in FIG. 7, and is electrically connected with the piezoelectric device 110 and with the pair of lead wires 120 by any suitable electrical interconnection means. Once again, the value of the capacitance of the on-board interface circuitry 140 is advantageously selected so as to provide a maximum output voltage level corresponding to the input range of a connected data acquisition system 150.

It is noted in FIG. 6 that the interface circuitry 140 (if externally provided) and the data acquisition system 150 will typically be located near the blasting machine 230 which initiates the blast. The data acquisition system 150 preferably includes a fast microcontroller with fairly high speed ADC conversion rate (e.g., 1-10 kHz). The voltage readings are collected and stored into a USB flash-drive, SD/multimedia card or other suitable storage medium. Thereafter, a laptop can access these voltages and convert them into peak pressures form the voltage transition points.

Figure 10:
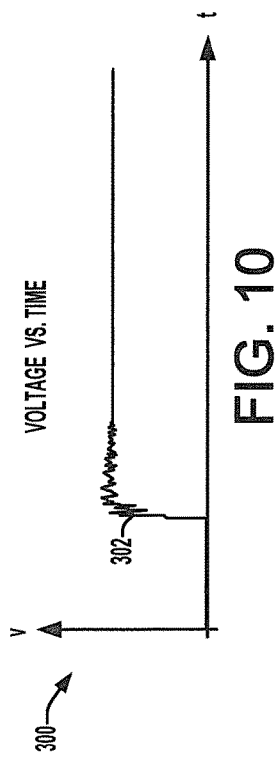
FIG. 10 is a graph showing an exemplary voltage output curve illustrating an output signal from an interface circuit coupled with a piezoelectric sensor apparatus during a blasting operation.

A graph 300 in FIG. 10 illustrates an exemplary voltage output curve 302 showing an output signal from an interface circuit 140 coupled with a single PZT piezoelectric sensor apparatus 100 during a blasting operation. In this example, the curve 302 represents the voltage output from a piezo disc 110 subjected to a detonator output 60 mm away. The interface circuitry capacitance in this example was approximately 5 nF, and the voltage output reached about 375V, corresponding to 13000 psi. In one particular implementation, the data acquisition system 150 and/or another computing device which obtains signal values from the data acquisition system 150 for the curve 302 can employ a spreadsheet or other computational application to calculate peak pressure using the capacitance value of the interface circuitry 140 and the peak output voltage from the interface circuitry 140 as follows:

| d33 | 650 pc/N |
|---|---|
| Cap of piezo | 5 nF |
| Cap of Storage cap | 5 nF |
| Peak Voltage | 376 V |
| Peak psi | 13,254 psi |

Figure 11:
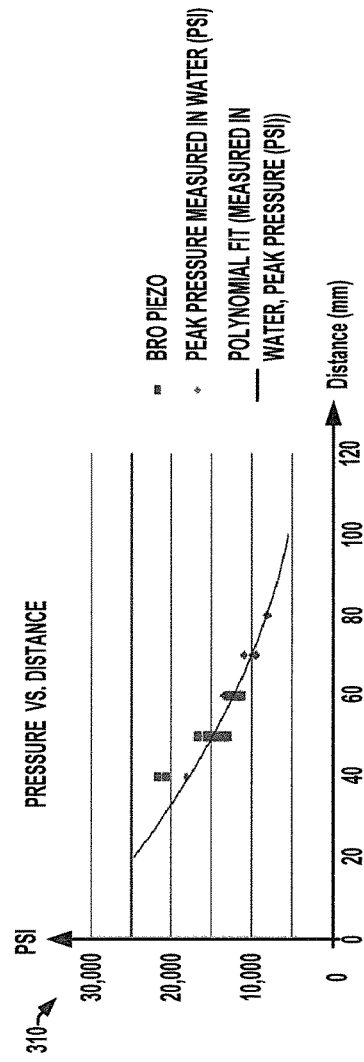
FIG. 11 is a graph illustrating comparative pressure measurements using a piezoelectric sensor apparatus and a commercial sensor.

FIG. 11 provides a graph 310 illustrating comparative pressure measurements using a piezoelectric sensor apparatus 100 as described above as well as a commercial sensor (made by PCB). Below is another exemplary computation showing that the pressure readings form the set-up is fairly close to those obtained using a commercial sensor which is bulky and expensive.

| Storage Cap (nF) | Voltage output (V) | Peak Pressure (psi) |
|---|---|---|
| 10 | 50 | 3966 |
| | 100 | 7931 |
| | 150 | 11897 |
| | 200 | 15862 |
| 1000 | 1 | 3569 |
| | 2 | 7138 |
| | 3 | 10707 |
| | 5 | 17845 |

Figure 12:
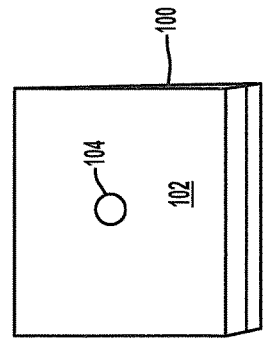
FIGS. 12-14 are perspective views illustrating an exemplary piezoelectric sensor apparatus and incorporation thereof into a booster for sensing borehole pressure during blasting operations.
Figure 14:
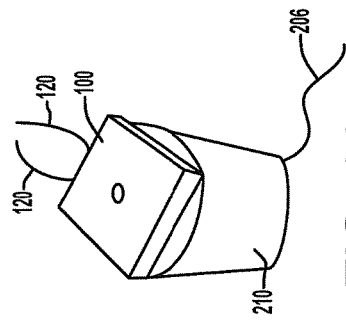
Figure 13:
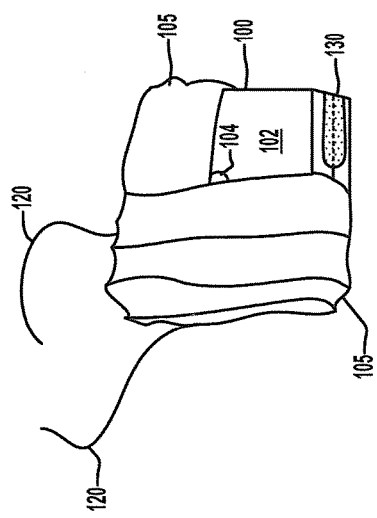

FIGS. 12-14 illustrate an exemplary piezoelectric sensor apparatus 100 and incorporation thereof into a booster 210 (FIG. 14) for sensing borehole pressure during blasting operations. In this example, the housing 102 was fabricated from two pieces of wood, one of which was drilled to form an aperture 104 (FIG. 12). Wire leads 120 were fed out of the apparatus 100, and silicone grease 130 was provided between the two pieces of wood 102. Tape 105 can be used to wrap the apparatus 100 (FIG. 13) with the aperture 104 exposed, and this assembly was taped to the bottom of a blasting booster 210 (FIG. 14) with the resulting booster/sensor assembly 210/100 having a detonator 204 installed with detonator leads 206 and pressure sensor leads 120 extending from the assembly (FIG. 14).

Figure 15:
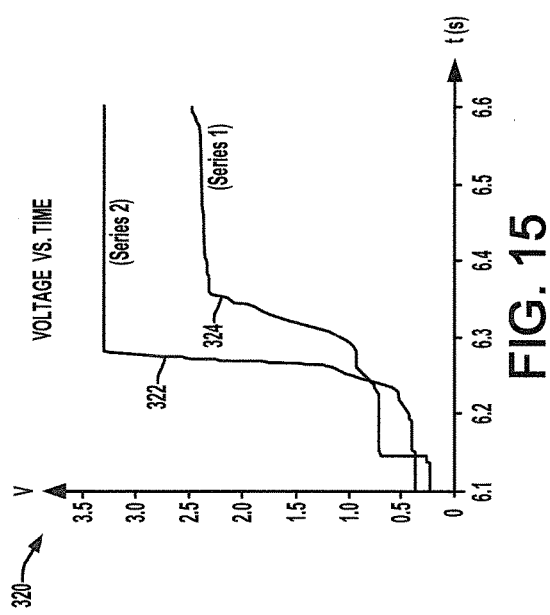
FIG. 15 is a graph illustrating piezoelectric-based sensor apparatus output data obtained during electronic detonator blast.

FIG. 15 is a graph 320 illustrating piezoelectric-based sensor apparatus output data curves 322 and 324 obtained during electronic detonator blasts. In these examples, sensors 100 were lowered inside boreholes in blasts using non-electric and electronic detonators 204, and detonators were activated in neighboring boreholes. As seen in FIG. 15, the output voltages 322 and 324 are shown as a function of time, wherein various voltages corresponding to the different peak pressures experienced by the sensors 100 are seen from detonations in neighboring adjacent boreholes. The maximum peak pressure measured using the two sensors indicated in FIG. 15 were calculated to be at 5100 and 9500 psi, respectively.

Referring also to FIGS. 16-23, the piezoelectric sensor device 110 was compared with a commercial pressure sensor inside a water tank where underwater testing of standard output electronic detonators were utilized. As seen in FIG. 16, the test set up 400 includes an oscilloscope or other data acquisition system 150 coupled to the piezoelectric sensor 102 via the interface circuit 140 which is spaced a distance D from a donor detonator 402, where a PCB 138A25 sensor 410 is also spaced from the donor detonator 402 and is coupled with a church amplifier 412, where the donor detonator 402, the piezoelectric sensor 102 and the PCB sensor 410 are underwater in the exemplary test set up 400. The comparative test results show excellent agreement between the measurements of both systems obtained in a range of 34-128 MPa, and the actual outputs also compared well with SPICE simulation results. Results were obtained on several blasts where non-electric and electronic detonators were used. Single primed and decked shots were monitored in dry holes, sympathetic pressures from neighboring boreholes or underlying decks of 34-48 MPa were measured while wet holes can exhibit almost 69 MPa of peak pressure. The system can measure a maximum pressure of 138 MPa in the boreholes. Pressure waves on the sensor 102 result in piezoelectric charge generation according to the formula Q=A*d33*P where Q=piezoelectric charge generated; A=area of sensor; d33=piezoelectric longitudinal charge voltage coefficient; and P=pressure. The charge is then sensed by the interface circuitry 140 and transformed into a voltage signal captured analog or digitally via an ADC of the scope or data logger or other data acquisition system 150.

During lab testing, the donor detonator 402 was an Austin E-star electronic detonator with aluminum shell containing 750 mg of PETN base charge, and a blasting machine (not shown) was utilized to function the donor detonator 402 when ready. This detonator 402 was inserted into a central fixture, and the piezoelectric element 102 was mounted in a fixture spaced from the donor detonator 402 at fixed distances D ranging from 80, 70, 60, 50 and 40 mm.

FIG. 17 provides a graph 420 with a curve 422 showing a typical voltage output of the interface circuit 140 based on pressure wave from a donor detonator 402 60 mm away from the piezoelectric element 102, where the output voltage in this example was monitored using a Tektronix 2024B scope 150 and an ×1000 PM-6102 probe. In this case, the output has a plateau at about 600 V and is similar to that obtained through SPICE simulation. The output can reach a few hundred volts but can be judiciously scaled by using the appropriate storage capacitor values in the interface circuit 140 (see FIG. 7 above). In one experiment, the voltage output was left intentionally high to obtain excellent signal to noise ratio in the beginning of testing.

A graph 430 in FIG. 18 illustrates the voltage output curve 432 resulting from multiple reflections of pressure waves detected inside the test water tank. These multiple waves add steps to the voltage output, as predicted by SPICE results. Below are two examples of calculations used to obtain the peak pressure in MPa from the value of the voltage peak and storage capacitance of the interface circuitry 140 using a d33 piezo element 110:

| | |
|---|---|
| d33 | 650 pc/N |
| Cap of piezo | 5 nF |
| Cap of Storage cap | 5 nF |
| Peak Voltage | 550 V |
| Peak Pressure | 133.7 MPa |
| d33 | 683 pc/N |
| Cap of piezo | 12.5 nF |
| Cap of Storage cap | 1000 nF |
| Peak Voltage | 2.8 V |
| Peak Pressure | 65.6 MPa |

A commercial pressure sensor 410 was used, made by PCB Piezotronics to calibrate and compare the pressure obtained using the novel piezoelectric elements 100. The 138A25 (Underwater ICP Blast Pressure sensor) sensor 410 is capable of measuring up to 172 MPa of pressure, and was connected to a PCB 482A22 ICP Signal Conditioner, displayed the peak pressure underwater during detonation.

Graph 440 in FIG. 19 shows the composite data of peak pressures using the novel piezoelectric element 102 and the PCB sensor 410, where the peak pressures follow an inverse relationship with distance D from the donor detonator 402, and the values calculated using the novel sensor elements 110 are fairly close to those obtained using the commercial system 410 for pressures <138 MPa and at donor detonator distances D of 40-80 mm.

Figure 20:
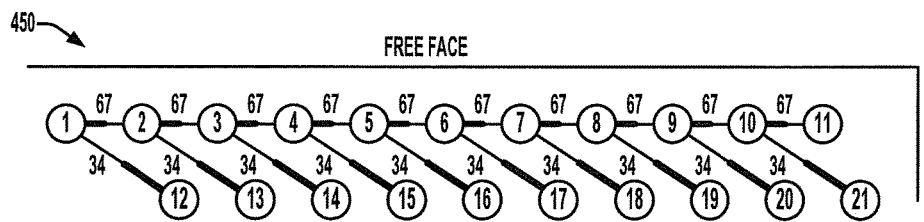
FIG. 20 is a blast diagram illustrating a first test site in which the piezoelectric sensors were tested.
Figure 21:
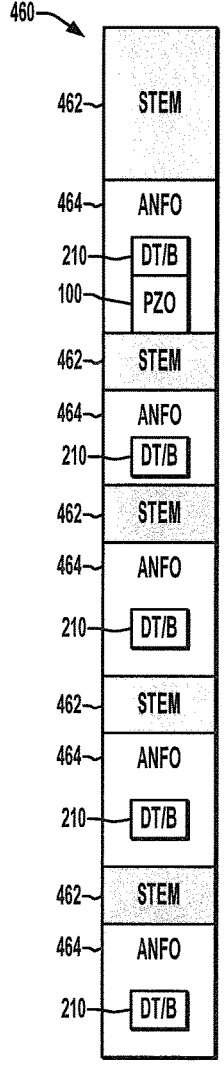
FIG. 21 is a partial side elevation view illustrating deck position of the piezoelectric sensor in the test setup of FIG. 20.

As seen in FIGS. 6 and 21, in field applications, the piezoelectric sensors 100 may be placed within the explosive columns 460, and are not expected to survive (including the legwires) the detonation and will not yield the in-situ detonation pressure. Thus these piezoelectric sensors 100 can yield only the sympathetic pressures from other adjacent blasts or form the decks below. As seen in FIGS. 20 and 21, a first field test was conducted in boreholes 450 containing decked shots containing shock tube detonators at a limestone quarry, in which 21 boreholes (numbered "1" through "21" in FIG. 20) were formed in two rows, where the boreholes were of a borehole diameter of 14.0 cm, borehole depth of 24.4 m, burden of 3.7 m, spacing of 4.3 m, stem depth of 2.1 m and water depth of 1.8 m, using 5 decks per borehole as seen in FIG. 21. The first borehole had delays of 201, 551, 576, 601 and 626 ms while the other boreholes used delays of 67, 417, 442, 467 and 492 ms. As seen in FIG. 21, stems 462 and interleaved ANFO explosives 464 were arranged in columns, with each explosive portion 464 including a detonator/booster (labeled as DT/B) 210, and the uppermost explosive portion 464 also including a piezoelectric sensor 100 (labeled PZO in the drawing). In one experiment, the deck immediately below the piezoelectric sensor contained 140 lb of ANFO and each borehole had up to 550 lb of explosives, and the two piezoelectric sensors 100 were placed on the bottom of the top boosters in boreholes #8 and #10, facing downwards where the shock tube detonators were attached.

Figure 22:
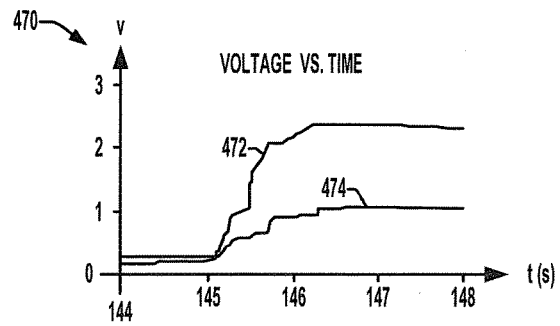
FIG. 22 is a graph illustrating sensor output voltages for two piezoelectric sensors in the first test site of FIG. 20.

FIG. 22 provides a graph 470 illustrating output voltages 472 and 474 registered on the sensing electronics based on the two piezoelectric sensors 100 in boreholes #8 and #10.

In this experiment, the measured peak pressures were calculated to be 36 MPa and 42 MPa in these boreholes #8 and #10, respectively.

Figure 23:
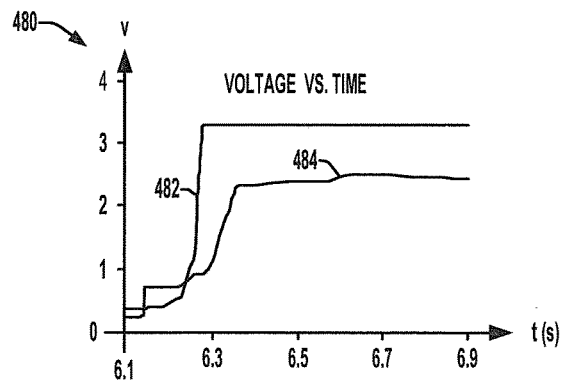
FIG. 23 is a graph illustrating output voltages of two piezoelectric sensors in a second test site.

Testing was also performed at a second test site (a limestone quarry) where Austin EStar electronic detonators 402 were used. In this experiment, there were 48 boreholes divided into three rows with borehole diameters of 16.5 cm, borehole depths of 14.5 m, burden of 4.6 m, spacing of 5.5 m and stem depth of 2.4 m. Two piezoelectric sensors were placed in the back row at the corner locations, where the blasting pressure was expected to be the highest coming from earlier detonations. Delay times of the detonators at these corner holes were 720 ms and 895 ms (last ones to fire). The borehole with the 720 ms delay was relatively dry (water depth of 2.1m), whereas the hole with the 895 ms delay was quite wet and was dewatered prior to loading the shot, and water could be seen still trickling from the borehole walls. FIG. 23 shows a graph 480 with output voltage curves 482 and 484 monitored during the blast. In this test, peak measured pressures were measured and calculated to be 66 MPa and 35 MPa in a wet hole and dry hole, respectively.

The presently disclosed piezoelectric sensors 100 with interface circuits 140 are thus operable to sense pressure pulses in boreholes during blasting from adjacent boreholes or underlying decks. These sensors and electronics were verified and calibrated in an underwater lab environment inside a water tank and donor detonators, and the obtained results were very close compared to those obtained using a commercial sensor system. Maximum pressure that can be measured can reach 138 MPa using such piezoelectric sensors 100.

Referring now to FIG. 24 another pressure sensor embodiment 100 is illustrated, in which the piezoelectric device 110, the lead wires 122, 124, the housing 102, etc. are generally as described above. In addition, the piezoelectric device 110 is at least partially covered with a heat shrink material 500, where the heat shrink material 500 can be any suitable heat shrink tubing or other material normally used for electrical connections. The heat shrink material 500 can be used in embodiments which include the aperture 104, as well as other embodiments having no aperture, and can be used in embodiments employing filler material 130 (e.g., FIG. 1 above) or embodiments having no such filler material. In addition, the heat shrink material 500 can be employed in implementations using an on-board interface circuit (e.g., circuit 140 above), and the heat shrink material 500 may, but need not, also cover such interface circuitry 140. Furthermore, such each shrink material 500 can be employed in embodiments utilizing more than one piezoelectric device 110 within the housing 102, with the material 500 at least partially covering multiple piezoelectric devices 110. Also, the interface circuitry itself may be adjusted or otherwise calibrated to accommodate or correct for pressure absorption or damping of the heat shrink material 500 such that the electrical output of the sensor apparatus and associated interface circuitry 140 accurately represents the measured borehole pressure during blasting operations.

FIGS. 25 and 26 show another exemplary pressure sensor apparatus with a piezoelectric element 110 encapsulated in a molded structure. The molded structure in the illustrated example includes a main portion 502 and a lead wire support portion 506, with the main portion encapsulating the piezoelectric device 110 and an optional associated circuit board 504 to which lead wires 120 are soldered or otherwise electrically coupled. In addition, the molded structure in this example includes an optional lead wire support 506, which may, but need not, include through holes 508 exposing portions of the encapsulated lead wires 120. Any suitable molding material can be used to construct the structure 502, 506, such as molding compound including without limitation Henkel Macromelt DM635 or equivalent. In the illustrated example, moreover, the main portion 502 of the molded structure has a length 510, such as about 1.42 inches, and an overall molded structure length 512, such as about 2.2 inches.

Other embodiments are possible including a variety of sizes and shapes for the molded structure, for example, cylindrical or tubular structures. Use of such a molded structure advantageously facilitates protection of the piezoelectric element from surrounding environmental conditions, particularly water and humidity. The lead wires 120 can be directly coupled to the piezoelectric device disk electrodes, or may be connected to an associated circuit board or other structure 504 as seen in FIGS. 25 and 26, and protrude from the molded structure for connection via waterproof connector for connectors to an appropriate external interface circuit 140 (or the interface circuit may be within the molded structure), wherein the lead wires 120 ultimately provide connection to the associated data acquisition system (e.g., data acquisition system 150 as described above). As with the above-mentioned use of heat shrink material 500, the full or partial encapsulation of the piezoelectric sensing element 110 in the molded structure 502, 506 may affect the pressure transducer performance of the apparatus 100, and thus the apparatus and associated interface circuit 140 may be tuned or calibrated to ascertain the degree of correction for the eventual calculation of pressure impinging on the piezoelectric device 110 through the molded material, particularly the main portion 502.

Referring also to FIG. 27, another embodiment is shown, in which the sensor apparatus 100 includes a metal shell structure 520, which can be cylindrical or tubular as shown, or may be of any suitable shape. In this regard, a cylindrical shape may be used such that one or more portions of the exterior of the molded structure contacts or engages an interior surface of the metal shell 520, although not a requirement for all embodiments of the present disclosure. Embodiments are also possible in which the sensor apparatus 100 includes a metal shell at least partially surrounding the piezoelectric device 110, without use of a molded structure. Furthermore, embodiments are possible in which a fully or partially surrounding metal shell structure 520 is used in combination with the above described filler material 130 (e.g., FIG. 1) and/or with heat shrink material 500 (e.g., FIG. 24 above). Furthermore, embodiments are possible in which he trick material 500 can be employed around a molded structure 502, 506, with the molded structure encapsulating (fully or at least partially) the piezoelectric sensor apparatus 110. Other embodiments are possible, in which heat shrink material 500 is provided around all or a portion of the outside of an included metal shell structure 520.

Figure 28:
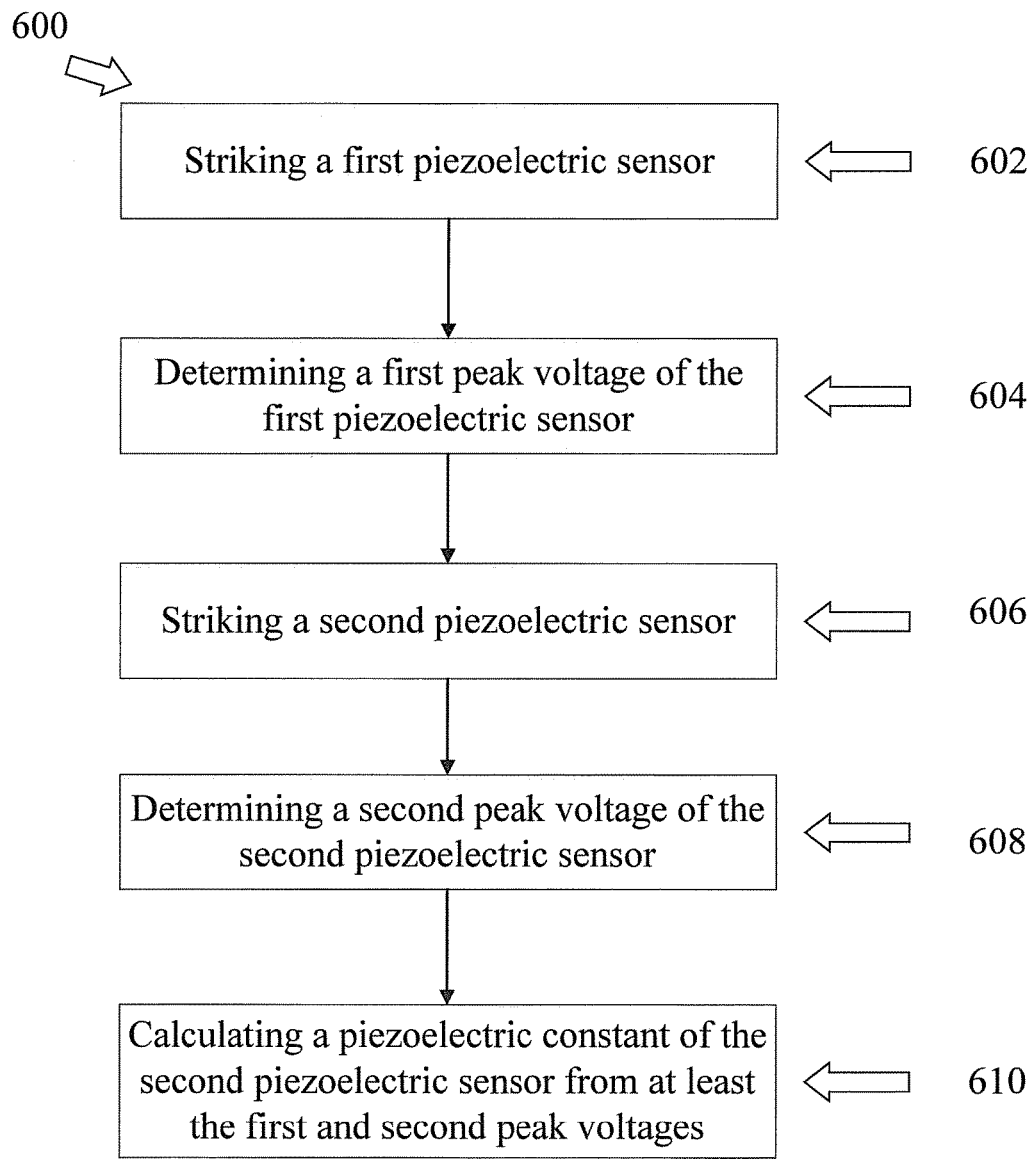
FIG. 28 is a flow chart showing an exemplary method of calibrating a piezoelectric sensor.

Referring to FIG. 28, after the pressure sensing apparatus 100 can be assembled, the piezoelectric sensor 110 should be calibrated to properly measure borehole pressure during blasting operations. For example, the effective d33 charge piezoelectric constant of the piezoelectric sensor 110 should be determined for improved accuracy peak pressure measurements of the pressure sensing apparatus 100.

To do so, a method 600 of calibrating the piezoelectric device 110 is provided. As shown in FIG. 28, the method 600 includes: striking a first piezoelectric sensor 110 of a first unmolded pressure sensing apparatus 100 (602); determining, with an interface circuit 140, a first peak voltage of the first piezoelectric sensor 110 during the striking thereof (604); striking a second piezoelectric sensor 110 of a second molded pressure sensing apparatus 100 (606); determining, with the interface circuit 140, a second peak voltage of the second piezoelectric sensor 110 during the striking thereof (608); and calculating a piezoelectric constant of the second piezoelectric sensor from at least the first and second peak voltages (610).

At 602, a first piezoelectric sensor 110 of a first unmolded pressure sensing apparatus 100 is struck. For example, the pressure sensing apparatus 100 shown in FIGS. 25 and 26 constitutes the first unmolded pressure sensing apparatus, without the molded structure 502, 506. To strike the first piezoelectric sensor 110, the first piezoelectric sensor is packaged and mounted on top of the PCB board 504, for example. The PCB board 504 serves as a mechanical backing to receive the pressure or force applied to the first piezoelectric sensor 110. The electrodes 112 and 114 (shown in FIG. 3) are attached to the top and bottom surfaces of the first piezoelectric sensor 110, further connected to the lead wires 120, with the whole assembly being molded in a suitable materials (e.g., polyurethane, epoxy, etc.).

The first unmolded pressure sensing apparatus 100 should have room to expand laterally when force or pressure is applied to its transverse electrodes; if such displacement is constricted the overall charge generation is attenuated, thus lowering the effective piezoelectric charge constant, d33. In a measuring system, the accurate pressure calculated can only be obtained by using such effective (and attenuated) d33 value. If the original uncorrected d33 value is used, the resultant calculated pressure will be lower than the actual value.

Figure 29:
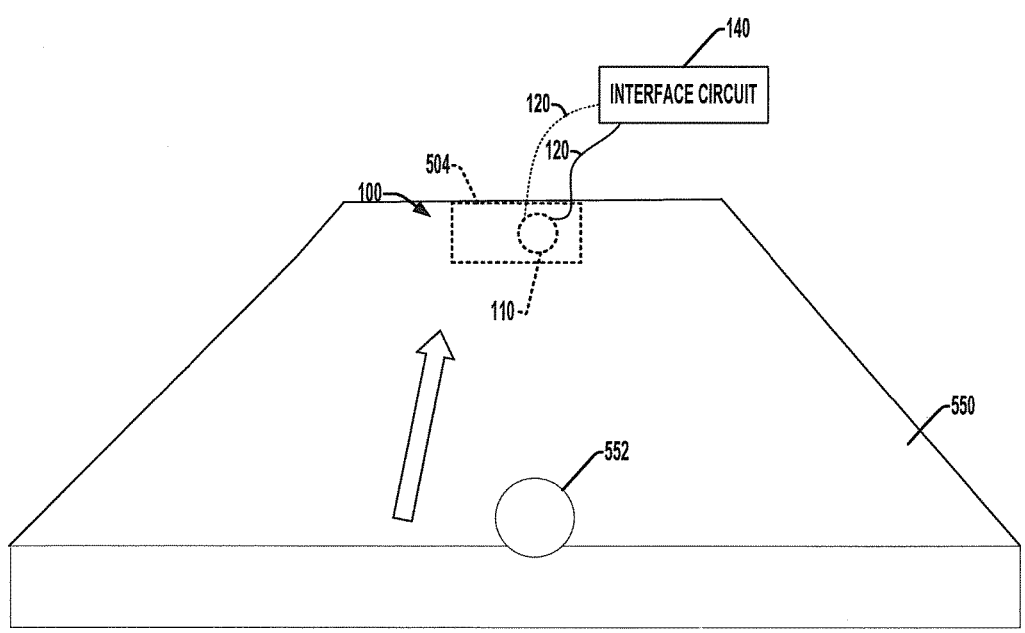
FIG. 29 is a schematic showing an exemplary system of calibrating a piezoelectric sensor.

Once the first unmolded pressure sensing apparatus 100 is assembled, the first piezoelectric sensor 110 can be calibrated. In one embodiment, as shown in FIG. 29, the first unmolded pressure sensing apparatus 100 is positioned at the bottom of a ramp 550 (e.g., having a 45 degree angle, or any other suitable angle). A flexible member 552 is then positioned at the top of the ramp, which has a fixed length, and rolled downwards along the ramp until the flexible member strikes the first piezoelectric sensor 110 at a constant velocity. The first piezoelectric sensor 110 is positioned at the bottom of the ramp so that the flexible member 552 strikes the first piezoelectric sensor perpendicularly. As a result, a consistent force or pressure is advantageously impinged on the first piezoelectric sensor 110. In addition, the flexible member 552 can be a tennis ball, so that the "squishing" of the tennis ball surface during impact helps to minimize any deviation in pressure or force (as opposed to a "hard" ball, such as a golf ball or a marble).

It will be appreciated that, instead of using a ramp, any other suitable technique can be used to strike the first piezoelectric sensor 110. In one example, the flexible member 552 (with a known weight) can be dropped in a free fall at a set height (i.e., at a constant acceleration) onto the first piezoelectric sensor 110. In another example, a pendulum (not shown) with known mass can be swung at fixed angle to strike the sensor first piezoelectric sensor 110. In addition, any other suitable technique can be used to strike the first piezoelectric sensor 110.

At 604, a first peak voltage of the first piezoelectric sensor 110 during the striking thereof is determined with the interface circuit 140. To do so, the piezoelectric sensor 110 is struck repeatedly (i.e., 602 is repeated) until a desired number of voltage measurements are obtained. The interface circuit 140 is configured to measure the voltage of the piezoelectric sensor 110 as it is struck by the flexible member 552. For example, as shown in FIG. 7, the interface circuit 140 includes a rectifier formed by diodes D 1-D4 for full bridge rectification and subsequent capacitive integration of the voltage signal provided by the piezoelectric sensor 110, and a charge storage (i.e., 1.5 nF) to quantify the piezoelectric charge generated upon impact. A scope (not shown) is used to then determine the peak voltage of the first piezoelectric sensor 110.

At 606, a second piezoelectric sensor 110 of a second molded pressure sensing apparatus 100 is struck. For example, the pressure sensing apparatus 100 shown in FIGS. 25 and 26 constitutes the second unmolded pressure sensing apparatus. 606 can be performed in substantially the same manner as 602. For example, the second molded pressure sensing apparatus 100 is positioned at the bottom of the ramp 550, and the flexible member 552 is rolled along the ramp to repeatedly strike the second piezoelectric sensor 110''. The primary difference between 602 and 606 is that the second molded pressure sensing apparatus 100 is molded, while the first pressure sensing apparatus 100 is not molded.

At 608, a second peak voltage of the second piezoelectric sensor 110 during the striking thereof is determined with the interface circuit 140. 608 can be performed in substantially the same manner as 604.

At 610, a piezoelectric constant of the second piezoelectric sensor is calculated from at least the first and second peak voltages. For example, the piezoelectric constant can be calculated from the formula:

$$d_{33,eff} = (Cp+Cs)*Vp*d33,cal/((Cb+Cs)*Vb),$$ Equation 1.

in which Cp corresponds to a capacitance of the second piezoelectric sensor; Cs corresponds to a storage capacitance of the interface circuit; Vp corresponds to the second peak voltage; d33,cal corresponds to the piezoelectric constant of the first piezoelectric sensor; Cb corresponds to a capacitance of the first piezoelectric sensor; and Vb corresponds to the first peak voltage. It will be appreciated that Cp, Cs, d33,cal, and Cb, can be determined prior to perform the method 600. Table 1 (below) shows the results of multiple interactions of 604 and 608.

TABLE 1

| Voltages Measured | | | | | |
|---|---|---|---|---|---|
| Baseline | | | Molded Piezo | | |
| d33 | 699 | | d33 | 322 | |
| cpiezo | 0.597 | nF | Cpiezo | 0.65 | nF |
| Cstorage | 1.5 | nF | Cstorage | 1.5 | nF |
| Voltage Peaks | | | | | |
| | 2.6 | V | | 1.09 | V |
| | 2.6 | V | | 1.14 | V |
| | 2.48 | V | | 1.16 | V |
| | 2.68 | V | | 1.19 | V |
| | 2.64 | V | | 1.29 | V |
| | 2.72 | V | | 1.21 | V |
| | 2.68 | V | | 1.19 | V |
| | 2.48 | V | | 1.02 | V |
| | 2.52 | V | | 1.33 | V |
| | 2.52 | V | | 1.1 | V |
| | 2.56 | V | | 1.06 | V |
| | 2.54 | V | | 1.15 | V |
| Ave | 2.59 | V | | 1.16 | V |
| Std dev | 0.08 | V | | 0.09 | V |

Table 1: Voltages Measured

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software and/or firmware, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The invention claimed is:

1. A method of calibrating a pressure sensing apparatus for measuring borehole pressure during blasting operations, the method comprising:
   striking a first piezoelectric sensor of a first unmolded pressure sensing apparatus;
   determining, with an interface circuit, a first peak voltage of the first piezoelectric sensor during the striking thereof;
   striking a second piezoelectric sensor of a second molded pressure sensing apparatus;
   determining with the interface circuit, a second peak voltage of the second piezoelectric sensor during the striking thereof; and
   calculating a longitudinal piezoelectric charge constant of the second piezoelectric sensor from at least the determined first and second peak voltages, known longitudinal charge constant of the first piezoelectric sensor, known capacitance of the first piezoelectric sensor, known capacitance of the second piezoelectric sensor, and known storage capacitance of the interface circuit; and calibrating the second molded pressure sensing apparatus based on the calculated longitudinal piezoelectric charge constant of the second piezoelectric sensor;

wherein a striking force is consistently utilized for both the striking the first piezoelectric sensor and the striking the second piezoelectric sensor.

2. The method of claim 1, wherein calculating a piezoelectric constant of the second piezoelectric sensor further includes:

calculating the piezoelectric constant from the formula:

$$d_{33,eff} = (Cp+Cs)*Vp*d33,cal/((Cb+Cs)*Vb),$$

in which

Cp corresponds to a capacitance of the second piezoelectric sensor;

Cs corresponds to a storage capacitance of the interference circuit;

Vp corresponds to the second peak voltage;

d33,cal corresponds to the piezoelectric constant of the first piezoelectric sensor;

Cb corresponds to a capacitance of the first piezoelectric sensor; and

Vb corresponds to the first peak voltage.

3. The method of claim 1, wherein striking a first piezoelectric sensor of a first unmolded pressure sensing apparatus and striking a second piezoelectric sensor of a second molded pressure sensing apparatus further includes:

striking the first and second piezoelectric sensors with a flexible member.

4. The method of claim 3, wherein striking the first and second piezoelectric sensors with a flexible member further includes:

rolling the flexible member towards the first and second piezoelectric sensors along a slope.

5. The method of claim 3, wherein striking the first and second piezoelectric sensors with a flexible member further includes:

dropping the flexible member towards the first and second piezoelectric sensors.

* * * * *